(12) United States Patent  (10) Patent No.: US 8,201,328 B2
Yaghmai et al.  (45) Date of Patent: Jun. 19, 2012

(54) COAXIAL CABLE TO PRINTED CIRCUIT BOARD INTERFACE MODULE

(75) Inventors: Roya Yaghmai, Los Angeles, CA (US); Frank B. Parrish, Simi Valley, CA (US); Daniel DeLessert, Newberg, OR (US)

(73) Assignee: Tyco Electronics Corporation, Berwyn, PA (US)

( * ) Notice: Subject to any disclaimer, the term of this patent is extended or adjusted under 35 U.S.C. 154(b) by 827 days.

(21) Appl. No.: 12/315,811

(22) Filed: Dec. 4, 2008

(65) Prior Publication Data

US 2009/0258538 A1 Oct. 15, 2009

Related U.S. Application Data

(60) Provisional application No. 61/013,631, filed on Dec. 13, 2007.

(51) Int. Cl.
*H01K 3/10* (2006.01)
*H05K 3/26* (2006.01)
*H05K 3/10* (2006.01)

(52) U.S. Cl. .............................. 29/852; 29/830; 29/846

(58) Field of Classification Search .................... 29/852, 29/830, 846; 324/754.01–754.3, 759.01–759.03; 174/250, 261–266
See application file for complete search history.

(56) References Cited

U.S. PATENT DOCUMENTS

| | | | | |
|---|---|---|---|---|
| 2,176,672 A * | 10/1939 | Jobst | ................................. | 300/3 |
| 3,502,418 A * | 3/1970 | Payne | ........................... | 401/215 |
| 3,643,319 A * | 2/1972 | Payne | ........................... | 29/441.1 |
| 3,793,707 A * | 2/1974 | Foll et al. | ......................... | 29/563 |
| 4,088,385 A * | 5/1978 | Adkins | ............................. | 29/860 |
| 5,077,876 A * | 1/1992 | McConkey | .................... | 29/27 R |
| 5,517,747 A * | 5/1996 | Pierro et al. | ..................... | 29/600 |
| 5,525,911 A * | 6/1996 | Marumo et al. | ......... | 324/754.07 |
| 5,534,787 A * | 7/1996 | Levy | ........................ | 324/754.09 |
| 5,553,645 A * | 9/1996 | Durney | .......................... | 144/365 |
| 6,188,297 B1 * | 2/2001 | Akiba | .............................. | 333/12 |
| 6,239,385 B1 * | 5/2001 | Schwiebert et al. | .......... | 174/261 |
| 6,264,476 B1 * | 7/2001 | Li et al. | ............................ | 439/66 |
| 6,267,026 B1 * | 7/2001 | Yamamoto | ........................ | 81/54 |
| 6,314,630 B1 * | 11/2001 | Munk et al. | ................. | 29/407.01 |
| 6,388,198 B1 * | 5/2002 | Bertin et al. | .................... | 174/251 |
| 6,413,019 B1 * | 7/2002 | Coombs et al. | ............... | 405/303 |
| 6,420,888 B1 * | 7/2002 | Griffin et al. | ............. | 324/754.11 |
| 6,515,499 B1 * | 2/2003 | Parrish et al. | ............. | 324/754.07 |
| 6,551,126 B1 * | 4/2003 | Feldman | ........................ | 439/482 |
| 6,686,732 B2 * | 2/2004 | Parrish | ...................... | 324/756.05 |
| 6,747,862 B1 * | 6/2004 | Skeoch | ......................... | 361/119 |
| 6,758,680 B2 * | 7/2004 | Duquerroy et al. | ............. | 439/63 |
| 6,830,216 B2 * | 12/2004 | Spinosa et al. | ............. | 244/122 A |
| 6,864,696 B2 * | 3/2005 | Logelin et al. | ............. | 324/754.07 |
| 6,939,175 B2 * | 9/2005 | Parrish et al. | ............. | 439/620.03 |
| 6,995,322 B2 * | 2/2006 | Chan et al. | ..................... | 174/262 |
| 7,096,555 B2 * | 8/2006 | Tourne et al. | .............. | 29/402.06 |
| D528,989 S * | 9/2006 | Dao | .............................. | D13/162 |

(Continued)

*Primary Examiner* — David Angwin

(57) ABSTRACT

In one implementation, a method is provided for constructing an interface module which includes constructing a board having a signal via through the board, and having at least one ground via extending through the board. The method further includes back drilling the signal via to create a center conductor hole above a remaining portion of the signal via and back drilling a shield opening in the board and at least part way into the at least one ground via such that a height of the center conductor hole is reduced. The method further includes plating the shield opening and the center conductor hole, and back drilling to remove a portion of the plating to electrically isolate the plated shield opening and the plated center conductor hole.

6 Claims, 4 Drawing Sheets

U.S. PATENT DOCUMENTS

| | | | | |
|---|---|---|---|---|
| 7,152,319 B2 * | 12/2006 | Chan et al. | | 29/852 |
| D535,260 S * | 1/2007 | Dao | | D13/162 |
| 7,180,321 B2 * | 2/2007 | Behziz et al. | | 324/756.07 |
| D554,593 S * | 11/2007 | Greenberg et al. | | D13/162 |
| D554,594 S * | 11/2007 | Greenberg et al. | | D13/162 |
| 7,291,790 B2 * | 11/2007 | Bachar et al. | | 174/262 |
| 7,337,537 B1 * | 3/2008 | Smetana, Jr. | | 29/852 |
| 7,404,251 B2 * | 7/2008 | Buchwalter et al. | | 29/852 |
| 7,509,740 B2 * | 3/2009 | Munk et al. | | 29/897.2 |
| 7,624,491 B2 * | 12/2009 | Polus | | 29/464 |
| 7,657,988 B2 * | 2/2010 | Greene | | 29/464 |
| 7,665,207 B2 * | 2/2010 | Fraley et al. | | 29/834 |
| 7,669,321 B1 * | 3/2010 | Levy et al. | | 29/852 |
| 7,676,920 B2 * | 3/2010 | Farkas et al. | | 29/852 |
| 7,748,990 B2 * | 7/2010 | Tutt et al. | | 439/66 |
| 7,815,466 B2 * | 10/2010 | Yaghmai et al. | | 439/581 |
| 7,816,932 B2 * | 10/2010 | Cartier, Jr. | | 324/755.07 |
| 7,977,583 B2 * | 7/2011 | Yaghmai et al. | | 174/350 |
| 7,997,907 B2 * | 8/2011 | Tutt et al. | | 439/66 |
| 2001/0040051 A1 * | 11/2001 | Lipponen | | 174/262 |
| 2007/0266288 A1 * | 11/2007 | Volkerink et al. | | 714/738 |
| 2009/0176406 A1 * | 7/2009 | Yaghmai et al. | | 439/581 |

\* cited by examiner

US 8,201,328 B2

COAXIAL CABLE TO PRINTED CIRCUIT BOARD INTERFACE MODULE

CROSS-REFERENCE TO RELATED APPLICATIONS

This application is an application under 35 USC 111(a) and claims priority under 35 USC 119 from Provisional Application Ser. No. 61/013,631, filed Dec. 13, 2007 under 35 USC 111(b). The disclosure of that provisional application is incorporated herein by reference.

BACKGROUND

Sophisticated electronic assemblies often employ dense arrays of electrical conductors to deliver signals from one area to another. Routing large groups of conductors in an efficient and organized manner often proves problematic for a variety of reasons. The overall assembly cost, form factor (size), conductor pitch, and complexity all typically must be taken into account to determine a suitable routing method.

For high performance semiconductor testers, sometimes referred to as automated test equipment or ATE, tester signals up to several gigahertz are funneled and delivered from relatively large circuit boards known as channel cards, to the leads of a very compact device under test or DUT. Often, several thousand signal paths provide the signal delivery scheme between the DUT and the tester electronics. In order to preserve fidelity for such high-frequency signals, the signal paths are constructed to provide as close to a matched fifty-ohm impedance as possible. Providing a closely matched impedance with a large number of signal paths is difficult.

Further, in the past, there is typically a connector between the cable and the interface module, which limits density, and does not allow for low cost contact.

What is needed is a tester interface module capable of delivering high frequency, high fidelity signals at low cost. Moreover, what is needed is a tester interface module and method capable of providing higher signal density with higher frequency and high fidelity at low cost.

SUMMARY

In one implementation, a method is provided for constructing an interface module which includes constructing a board having a signal via through the board, and having at least one ground via extending through the board. The method further includes back drilling the signal via to create a center conductor hole above a remaining portion of the signal via and back drilling a shield opening in the board and at least part way into the at least one ground via such that a height of the center conductor hole is reduced. The method further includes plating the shield opening and the center conductor hole, and back drilling to remove a portion of the plating to electrically isolate the plated shield opening and the plated center conductor hole.

BRIEF DESCRIPTION OF THE DRAWINGS

The features and advantages of the present invention will be better understood with regard to the following description, appended claims, and accompanying drawings.

DESCRIPTION

Figure 1A:
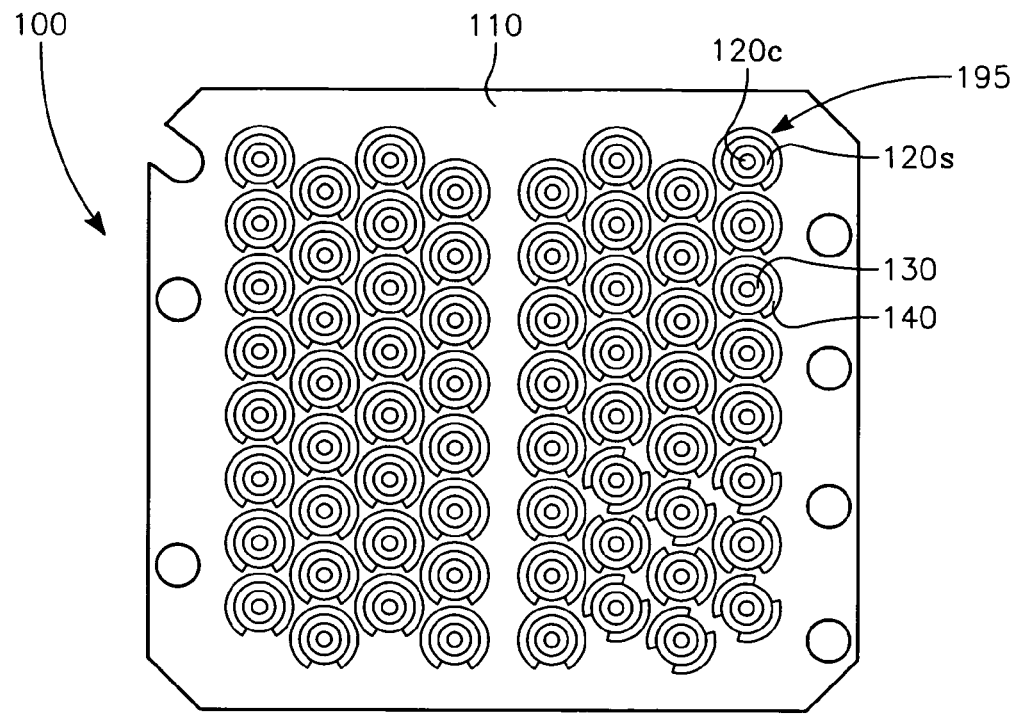
FIG. 1A shows a coax side of an interface module.

FIG. 1A shows a coax side 110 of an interface module 100. A coaxial cable (not shown in FIG. 1A) mounts within a coaxial receptacle 195 in the coax side 110 of the interface module 100. A plated center conductor via 120c and a plated shield conductor 120s are recessed within the coax side 110 of the interface module 100. The plated center conductor via 120c and the plated shield conductor 120s are separated by a non-plated portion 130. A shield pad 140 is shown partially surrounding the receptacle 195 opening.

Although not shown in FIG. 1A, the shield pad 140 and the plated shield conductor 120s are in electrical contact with ground vias (not shown in FIG. 1A), which extend through the interface module 100. The extent of the shield pad 140 will be dependent on the number and placement of the ground vias (not shown in FIG. 1A). The ground vias (not shown in FIG. 1A) extend through the interface module 100 and are in electrical contact with the ground plane 180, shown in FIG. 1B, on an interface side 160 of the interface module 100.

Figure 1B:
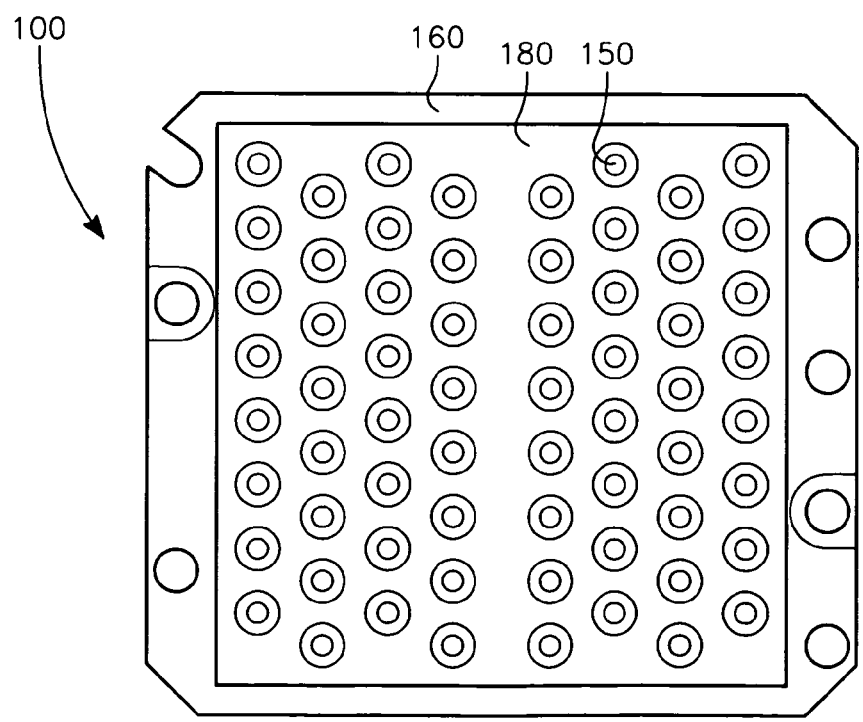
FIG. 1B shows the interface side of the interface module.

FIG. 1B shows the interface side 160 of the interface module 100. The interface side 160 has the ground plane 180 and center conductor via pads 150.

Figure 1C:
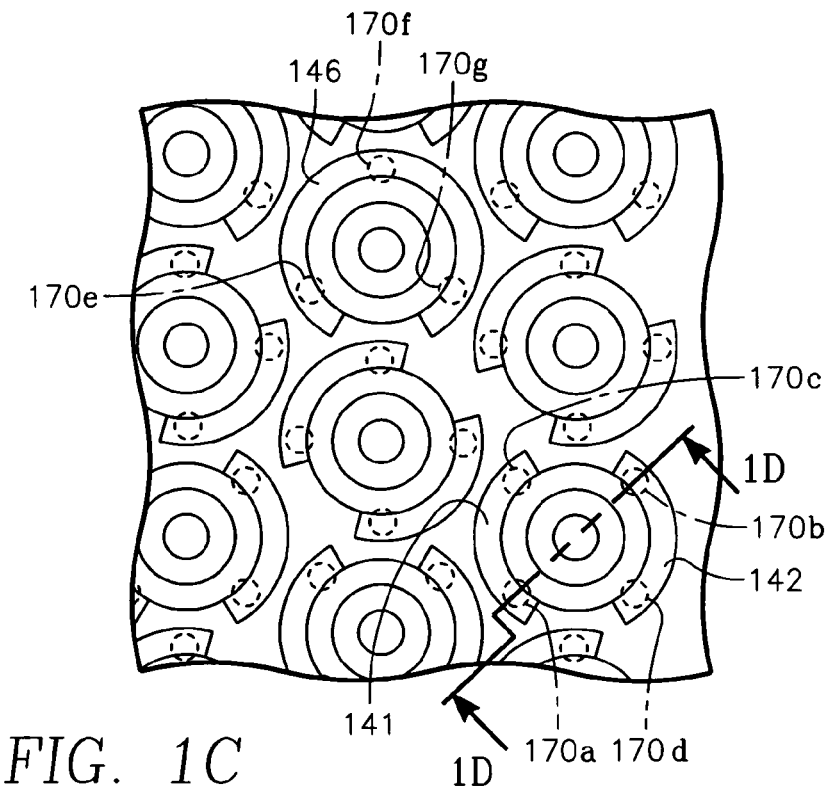
FIG. 1C shows an enlarged top view of a portion of the interface module of FIG. 1A.

FIG. 1C shows an enlarged top view of a portion of the interface module 100 of FIG. 1A. Surface pads 141 and 142 are formed to contact the ground vias 170a and 170c, and 170b and 170d, respectively. As discussed above, the number and arrangement of ground vias and pads may vary. For example, FIG. 1C shows coaxial cable receptacles with 3 ground vias 170e-g, and one shield pad 146, and with 4 ground vias 170a-d and a pair of shield pads 141 and 142. Other configurations are possible.

Figure 1D:
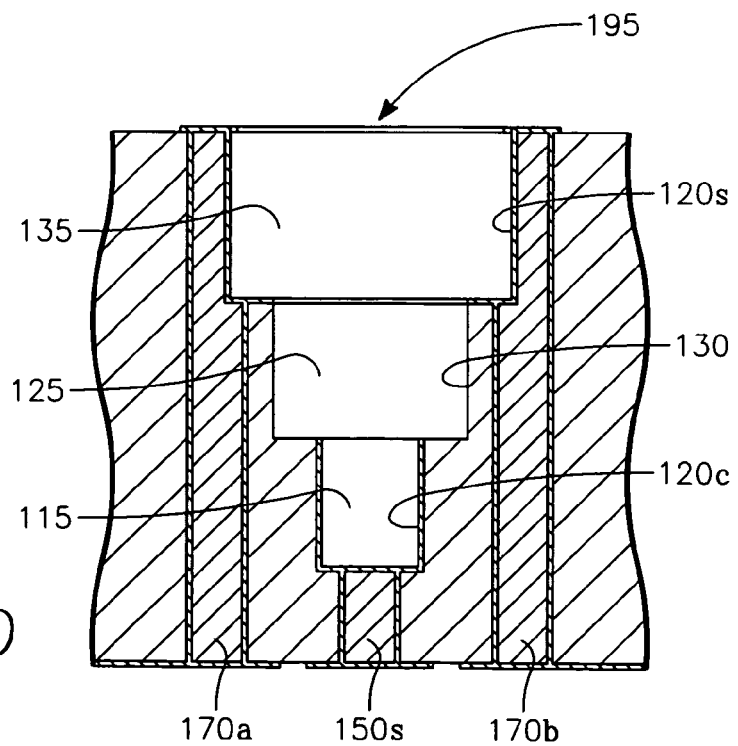
FIG. 1D shows a cut away side view of a coaxial cable receptacle of the interface module along the 1D-1D line of FIG. 1C.

FIG. 1D shows a cut away side view of a coaxial cable receptacle 195 of the interface module 100 shown in FIG. 1A. The coaxial cable receptacle 195 has center conductor opening 115, which is sized to accommodate a coaxial center conductor (not shown in FIG. 1D) has electrically conductive plating 120c. The plating 120c extends over the Signal via 150s. An opening 125, which may be sized to accommodate a coaxial insulator (not shown in FIG. 1D), electrically separates the center conductor and a shield plating 120s, which plates a shield opening 135. As shown, the plating 120s in the shield opening 135 contacts the ground vias 170a and 170b. In the embodiment of FIG. 1D, the opening extends into the ground vias 170a and 170b.

Figure 2A:
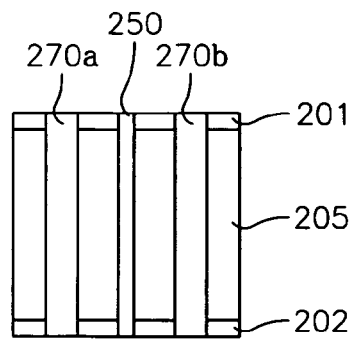
FIGS. 2A-2G show a cut away side view of a method for fabricating the interface module of FIGS. 1A and 1B.

FIGS. 2A-2G show a cut away side view of a method for fabricating the interface module 100 of FIGS. 1A and 1B. FIG. 2A shows a side view of a partially fabricated interface module 100 (FIGS. 1A & 1B). A typical printed circuit board process is used to form ground vias 270a and 270b and signal via 250 through the printed circuit board 205. For example, the ground vias 270a and 270b and signal via 250 may be drilled, plated, and filled. The ground vias 270a and 270b and signal via 250 may be drilled through surface conductors 201 and 202, as shown.

Figure 2E:
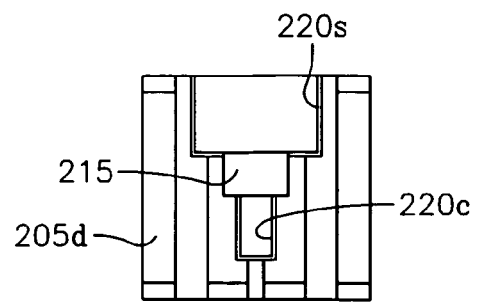
Figure 2B:
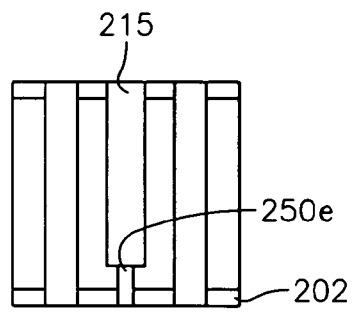

In FIG. 2B, the signal via 250e is back drilled to create a center conductor opening 215. Shown in FIG. 2C, a shield opening 225 is drilled wider than the center conductor opening 215. This is done after drilling the center conductor opening 215, as shown in FIG. 2C. The back drilling should at least partially expose, or even cut into a portion of the ground vias 270e and 270f as shown.

Figure 2F:
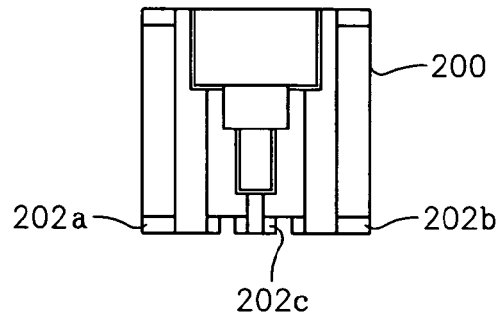
Figure 2C:
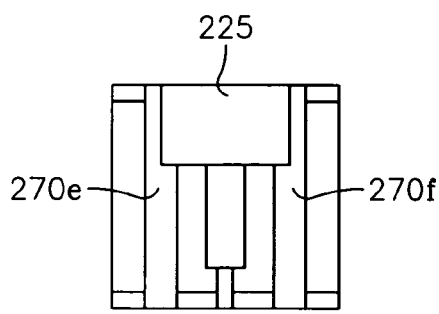
Figure 2D:
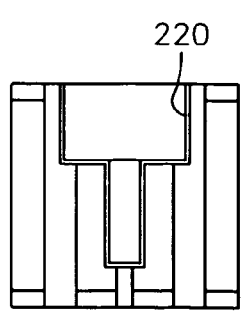

A plating 220 is deposited in the openings 225 and 215 as illustrated in FIG. 2D. Thereafter, as shown in FIG. 2E, a portion of the plating is removed by back drilling into the printed circuit board 205d to separate the shield plating 220s from the center conductor plating 220c.

FIG. 2F shows the surface conductor 202 (FIG. 2A) after etching to define a center conductor pad 202c and shield pads 202a and 202b.

Figure 2G:
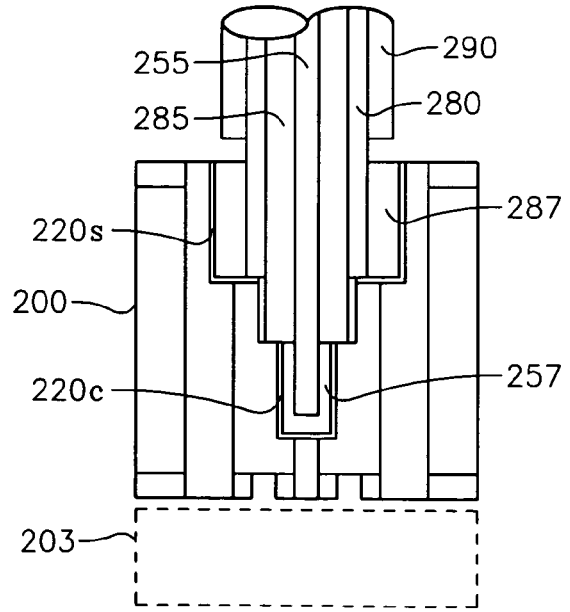

Turning to FIG. 2G, a coaxial cable 290 is inserted into the interface module 200. The shield 280 and center conductor 255 are electrically bonded to the shield plating 220s and the center conductor plating 220c, respectively. For example, the shield 280 and center conductor 255 may be bonded with solder 287 and 257, respectively, conductive epoxy, or other material capable of securing and making electrical contact. The interface side of the interface module 200 may optionally contact an interposer 203.

Figure 3:
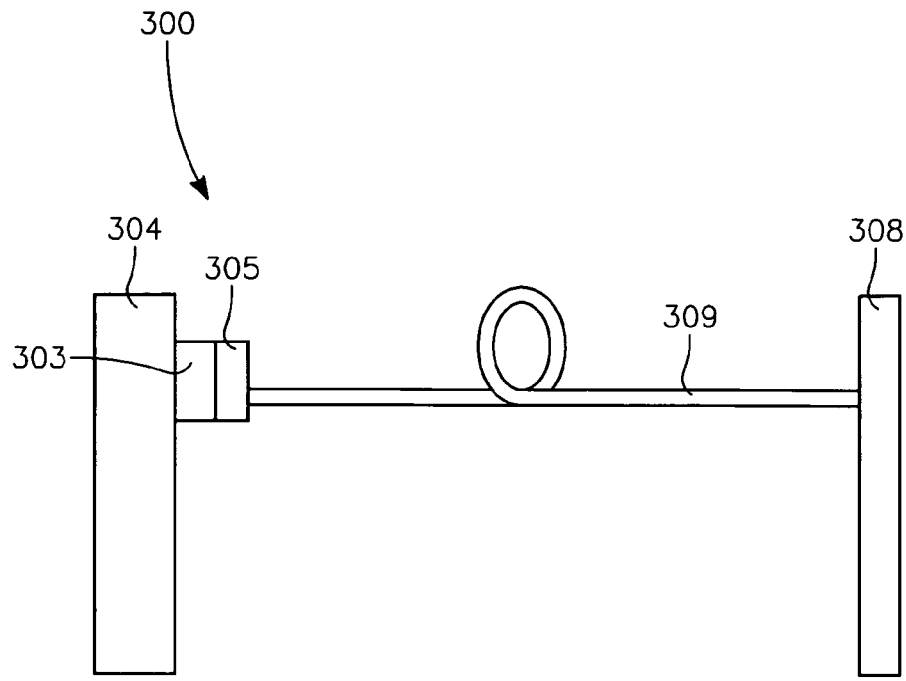
FIG. 3 shows a block diagram possible embodiment, which may include the interface module of FIGS. 1A and 1B.

FIG. 3 shows a block diagram possible embodiment 300, which may include the interface module 100. In this embodiment, a cable assembly 309 having many coaxial cables (not shown) connected at one side to a lower cable density electronics board 308 is coupled to a higher signal density interface board 304 with the interface module 305. An interface side of the interface board 304 contacts an interposer 303, preferably a compliant interposer 303, which contacts the interface board 304. The interface board 304 may contact one or more devices under test (not shown). Thus, signals from many (not shown) electronics boards 308 may be routed to a single interface board 304.

Figure 4:
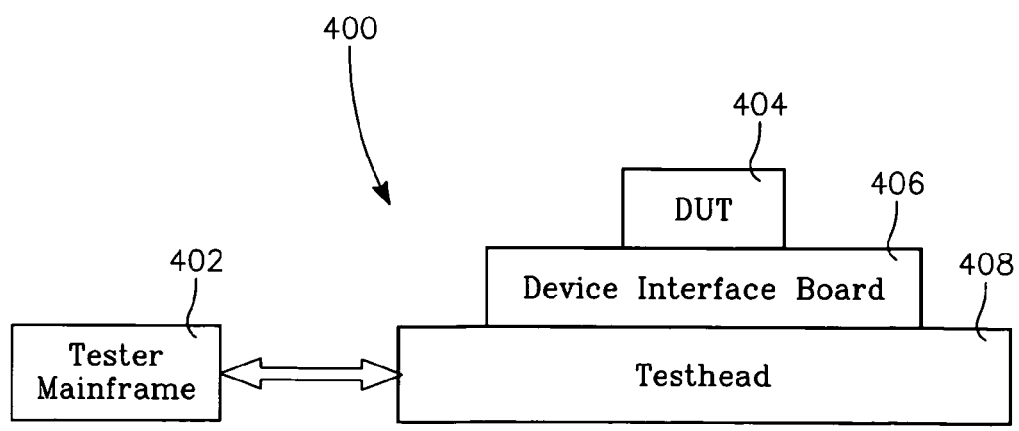
FIG. 4 a block diagram of one embodiment of a tester, which may include the interface module of FIGS. 1A and 1B.

FIG. 4 a block diagram of one embodiment of a tester 400, which may include the interface module 100 (shown in FIG. 1). The tester 400 includes a tester mainframe 402 that is in communication with a test head 408. The test head 408 is connected to an interface board 406. Signals from the test head 408 may be routed to the interface board 406 through the tester interface module (not shown in FIG. 4), as illustrated in FIG. 3, for example. In the embodiment shown in FIG. 4, the interface board 406 is a device interface board or DIB. In operation, the device interface board 406 is electrically connected to a device under test (DUT) 404 for testing the DUT 404. For example, the tester 400 may be an automated test equipment (ATE) system for testing integrated circuits, and the DUT 404 may be a semiconductor device including an integrated circuit. Thus, signals from the test head 408 may be routed to the interface board 406 through the interface module (not shown in FIG. 4).

The tester mainframe 402 includes circuitry for generating test signals and evaluating test signals. The tester mainframe 402 sends test signals to the DUT 404 and receives test signals from the DUT 404 through the test head 408 and the interface board 406. The DUT 404 may be a packaged silicon die including an integrated circuit to be tested. In another embodiment, the interface board 406 is a probe interface board, and the DUT 404 may be a semiconductor wafer including an integrated circuit to be tested.

Although the term "coaxial cable" is used herein for example purposes, the term is merely illustrative and intended to include axial cables in general including concentric cables such as coaxial cable, triaxial cable, or other multiaxial cable, as well as twinaxial cable, and non-concentric cable, and impedance controlled cable in general, or any assortment thereof.

The printed circuit board or printed wire board may be fabricated with printed circuit board sequential lamination technology known in the art. Further, although referred to as a printed circuit board or printed wire board, it may be any insulating board that allows via formation and back drilling.

The interface module may be a tester interface module for example. Nevertheless, the teachings herein apply to any interface module, which may also be referred to as an interface means, connection means, connector, adaptor, translator, etc.

Having described this invention in connection with a number of embodiments, modification will now certainly suggest itself to those skilled in the art. As such, the invention is not to be limited to the disclosed embodiments, except as required by the appended claims.

What is claimed is:

1. A method for constructing an interface module comprising:
   (a) constructing a board comprising a signal via through the board, and comprising at least one ground via extending through the board;
   (b) back drilling the signal via to create a center conductor hole above a remaining portion of the signal via;
   (c) back drilling a shield opening in the board and at least part way into the at least one ground via such that a height of the center conductor hole is reduced;
   (d) plating the shield opening and the reduced height center conductor hole;
   (e) back drilling to remove a portion of the plating to electrically isolate the plated shield opening and the plated reduced height center conductor hole.

2. The method of claim 1, wherein back drilling to remove a portion of the plating between the plated shield opening and the plated remaining portion of the center conductor hole comprises removing a portion of the board such that the drilling to remove the portion of the plating furthering reduces the height of the center conductor hole.

3. The method of claim 1, further comprising inserting a coaxial cable into the board and electrically bonding a center conductor of the coaxial cable to the plated center conductor hole and electrically bonding a shield of the coaxial cable to the plated shield hole.

4. The method of claim 1, wherein constructing the board further comprises:
   (a) plating a coax side of the board; and
   (b) etching the coax side to create a shield pad electrically coupled to the at least one ground via.

5. The method of claim 1, wherein constructing the board further comprises:
   (a) plating an interface side of the board; and
   (b) etching the interface side to define center conductor pads such that the center conductor pads are electrically coupled to the remaining signal via at the interface side of the board.

6. The method of claim 1, wherein constructing the board comprising the signal via comprises constructing the board having a filled signal via.

* * * * *